United States Patent
Han et al.

(10) Patent No.: US 7,196,876 B2
(45) Date of Patent: Mar. 27, 2007

(54) METHOD TO MAKE ABUTTED JUNCTION GMR HEAD WITHOUT LEAD SHUNTING

(75) Inventors: Cherng-Chyi Han, San Jose, CA (US); Mao-Min Chen, San Jose, CA (US); Pokang Wang, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 1067 days.

(21) Appl. No.: 10/236,359

(22) Filed: Sep. 6, 2002

(65) Prior Publication Data

US 2004/0047082 A1 Mar. 11, 2004

(51) Int. Cl.
G11B 5/39 (2006.01)
G11B 5/33 (2006.01)
G11B 5/127 (2006.01)

(52) U.S. Cl. .............................. 360/324.1; 360/324.12; 29/603.14

(58) Field of Classification Search ............. 360/324.1, 360/324.12, 324.11; 29/603.14
See application file for complete search history.

(56) References Cited

U.S. PATENT DOCUMENTS

| | | | |
|---|---|---|---|
| 5,491,600 A * | 2/1996 | Chen et al. ................. 360/322 |
| 5,828,531 A | 10/1998 | Gill ............................. 360/113 |
| 5,883,764 A * | 3/1999 | Pinarbasi ..................... 360/322 |
| 6,185,078 B1 | 2/2001 | Lin et al. ................ 360/324.12 |
| 6,324,037 B1 | 11/2001 | Zhu et al. ............... 360/324.12 |
| 6,344,953 B1 | 2/2002 | Kautzky et al. ............. 360/322 |
| 6,493,926 B2 * | 12/2002 | Han et al. ................. 29/603.14 |
| 6,556,392 B1 * | 4/2003 | Mao et al. .............. 360/324.12 |
| 6,697,235 B2 * | 2/2004 | Ohtsu et al. ............ 360/324.12 |
| 6,857,180 B2 * | 2/2005 | Horng et al. ............. 29/603.14 |
| 6,954,343 B2 * | 10/2005 | Larson et al. .......... 360/324.12 |
| 7,016,165 B2 * | 3/2006 | Chien et al. ........... 360/324.12 |

* cited by examiner

*Primary Examiner*—Andrea Wellington
*Assistant Examiner*—Christopher R. Magee
(74) *Attorney, Agent, or Firm*—Saile Ackerman LLC; Stephen B. Ackerman

(57) ABSTRACT

A method for forming an abutted junction GMR bottom spin valve sensor in which the free layer has a maximum effective length due to the elimination or minimization of bias layer and conducting lead layer overspreading onto the sensor element and the consequent reduction of current shunting. The overspreading is eliminated by forming a thin dielectric layer on the upper surface of the sensor element. When the biasing and conducting leads are formed on the abutted junction, they overspread onto this layer and the overspread can be removed by an ion-milling process during which the dielectric layer protects the sensor.

12 Claims, 3 Drawing Sheets

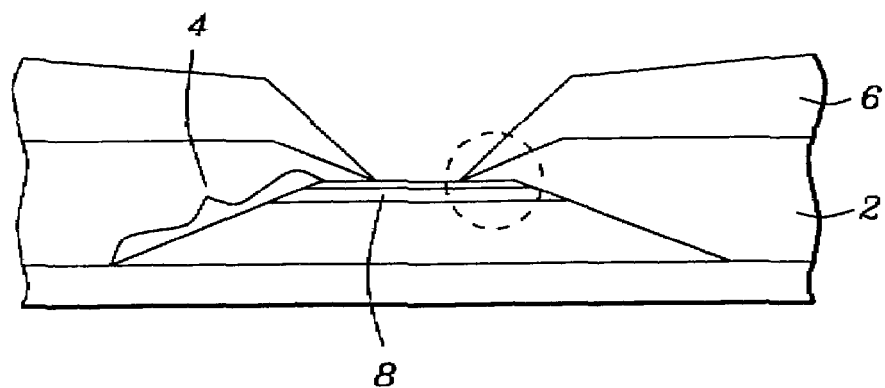
FIG. 1 - Prior Art
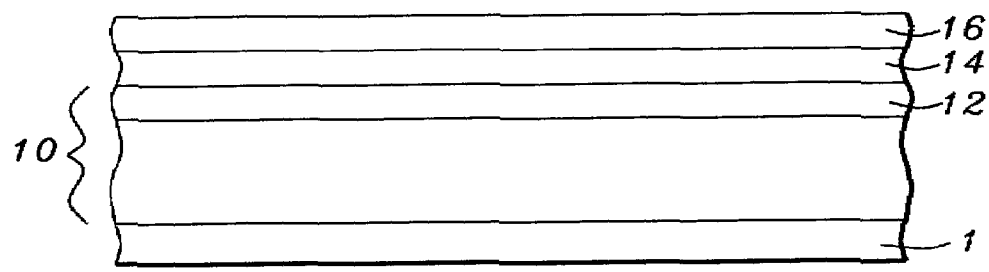
FIG. 2a
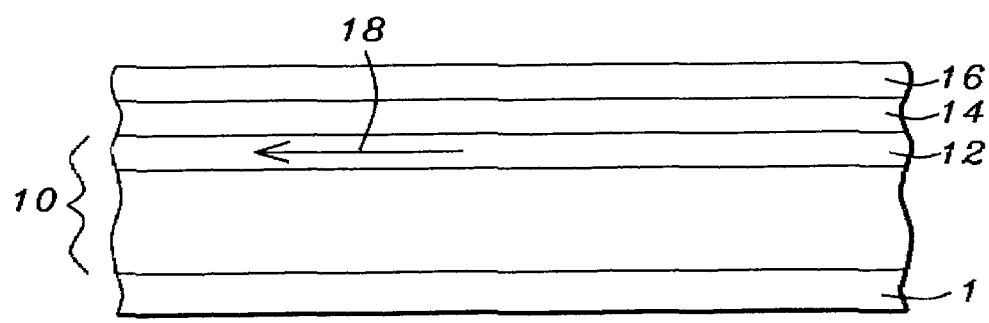
FIG. 2b

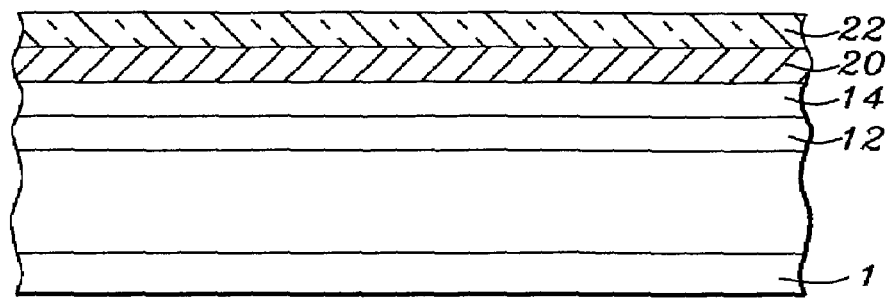
FIG. 2c
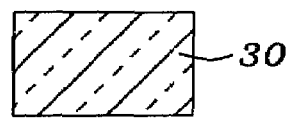
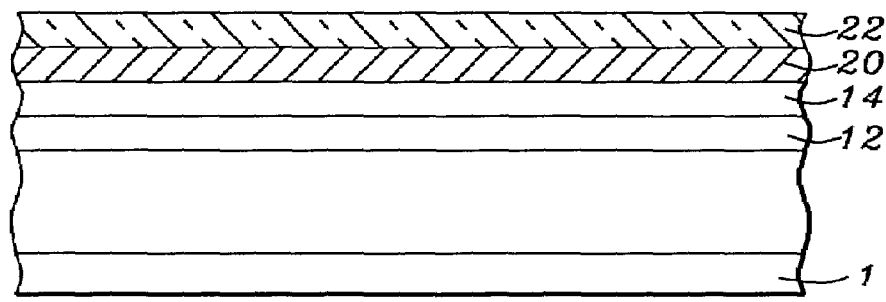
FIG. 2d
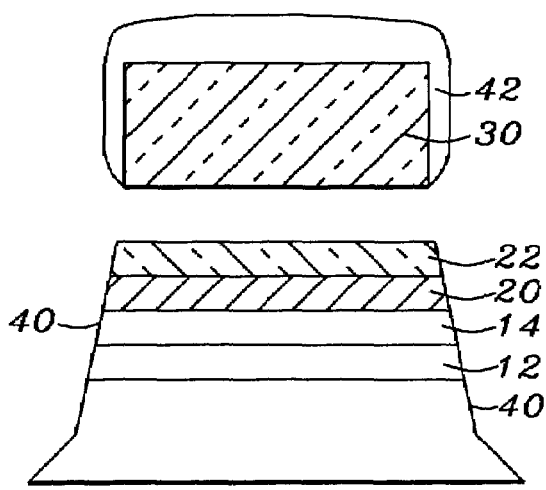
FIG. 3

US 7,196,876 B2

METHOD TO MAKE ABUTTED JUNCTION GMR HEAD WITHOUT LEAD SHUNTING

BACKGROUND OF THE INVENTION

1. Field of the Invention

This invention relates generally to the fabrication of a giant magnetoresistive (GMR) read head, more specifically to the fabrication of an abutted junction GMR read head having a free layer of maximal effective length resulting from the elimination of overspreading of the biasing and lead layers.

2. Description of the Related Art

Magnetic read heads whose sensors make use of the giant magnetoresistive effect (GMR) in the spin-valve configuration (SVMR) base their operation on the fact that magnetic fields produced by data stored in the medium being read cause the direction of the magnetization of one layer in the sensor (the free magnetic layer) to move relative to a fixed magnetization direction of another layer of the sensor (the fixed or pinned magnetic layer). Because the resistance of the sensor element is proportional to the cosine of the (varying) angle between these two magnetizations, a constant current (the sensing current) passing through the sensor produces a varying voltage across the sensor which is interpreted by associated electronic circuitry. The accuracy, linearity and stability required of a GMR sensor places stringent requirements on the magnetization of its fixed and free magnetic layers. The fixed layer, for example, has its magnetization "pinned" in a direction normal to the air bearing surface of the sensor (the transverse direction) by an adjacent magnetic layer called the pinning layer. The free layer is magnetized in a direction along the width of the sensor and parallel to the air bearing surface (the longitudinal direction). Layers of hard magnetic material (permanent magnetic layers) or laminates of antiferromagnetic and soft magnetic materials are typically formed on each side of the sensor and oriented so that their magnetic field extends in the same direction as that of the free layer. These layers, called longitudinal biasing (or bias) layers, maintain the free layer as a single magnetic domain and also assist in linearizing the sensor response by keeping the free layer magnetization direction normal to that of the fixed layer when quiescent. Maintaining the free layer in a single domain state significantly reduces noise (Barkhausen noise) in the signal produced by thermodynamic variations in domain configurations. A magnetically stable spin-valve sensor using either hard magnetic biasing layers or ferromagnetic biasing layers is disclosed by Zhu et al. (U.S. Pat. No. 6,324,037).

A common configuration of the longitudinal biasing layer when it is formed of hard magnetic material is the abutted junction, wherein the biasing layer abuts the lateral edges of the GMR sensor element, which have been shaped to produce a smooth, linear contour against which to form the biasing layer. The biasing layer, when so placed, biases the free layer of the sensor element by direct magnetostatic coupling, stabilizing its domain structure and bias point (the orientation of its magnetic moment when quiescent). Zhu et al. (cited above) teaches the formation of an abutted junction having a spacer layer between the hard magnetic biasing layer and the junction region. Lin et al. (U.S. Pat. No. 6,185,078) teaches the formation of an abutted junction wherein a ferromagnetic film magnetostatically couples to a ferromagnetic free layer. Kautzky et al. (U.S. Pat. No. 6,344,953) teaches a configuration in which the biasing layer abuts the sensor in an abutting junction, but the current carrying leads overlay the biasing layer and the top surface of the sensor. Gill (U.S. Pat. No. 5,828,531) also teaches the formation of a spin valve sensor having an abutted junction biasing layer, but with a conducting lead layer that produces a current at an angle to the air bearing surface of the sensor.

The abutted junction has both advantages and disadvantages. An advantage is that it enables a simple and direct definition of the read width of the sensor by physical removal of all portions of the sensor element except that which lies between the hard biasing layers. The necessity of reading magnetic storage media of increasingly higher area densities places stringent requirements on the dimensions of the sensor read width, so the narrow abutted junction formation is advantageous. A disadvantage is that reducing the read width of an abutted junction sensor requires removal of a large portion of the actual element and, therefore, a corresponding reduction of the width of the free layer and loss of signal strength. Another source of reduced signal strength in the abutted junction is a result of the conducting lead layer configuration, which is typically over the biasing layer. Unavoidably, the biasing layer and the conducting lead layer spread over the lateral edge of the sensor, as is illustrated schematically in FIG. 1 (prior art). FIG. 1 shows a schematic cross-sectional view of an abutted junction sensor having a bottom spin valve configuration in which the free layer (8) is positioned at the top of the sensor element (4). The hard biasing layer (2) abuts the sensor element (4), contacting the lateral ends of the free layer and the conducting lead layer (6) is formed over the biasing layer. The dashed circled region shows the overspreading of the biasing layer and the lead layer. This overspread has the disadvantageous effect of reducing the sensitivity of the sensor even beyond the reduction resulting from the narrowed free layer. The overspread allows sensing current carried by the lead layers to be shunted through lateral edge portions of the free layer, reducing its effective usable length and, therefore, its sensitivity.

Although the physical reduction of free layer width is unavoidable in the abutted junction, the overspreading of the conducting lead layer and the biasing layer can be significantly reduced. It is the object of the present invention to provide a method of producing that reduction.

SUMMARY OF THE INVENTION

It is a first object of the present invention to provide an abutted junction GMR bottom spin valve sensor capable of reading narrow trackwidths while producing a strong output signal.

It is a second object of the present invention to provide an abutted junction GMR bottom spin valve sensor wherein the effective width of the free layer is maximized.

It is a third object of the present invention to provide an abutted junction GMR bottom spin valve sensor whose free layer sensitivity is improved as a result of the elimination of current shunting.

The objects of the present invention will be achieved by a method of forming an abutted junction GMR bottom spin valve that significantly reduces or eliminates conducting lead and biasing layer overspreading, which is the undesirable spreading of the conducting lead layer and the biasing layer beyond the abutting junction so as to partially cover the upper surface of the spin valve sensor element and produce current shunting through the sensor. Novel aspects of the method include: 1) formation of a thin dielectric layer between the GMR sensor element capping layer and the double layer of hard magnetic biasing material and conducting lead layer. 2) Adjustment of the angle of the junction so that ion-beam deposition (IBD) of the hard magnetic biasing layer only contacts the junction region of the GMR sensor and the layer does not become deposited on the upper region of the sensor. 3) Ion beam etch (IBE) to remove lead layer overspread.

BRIEF DESCRIPTION OF THE DRAWINGS

FIG. 1 is a prior art schematic drawing of an abutted junction GMR bottom spin valve having a hard magnetic biasing layer overlaid with a conducting lead layer wherein the lead layer overspreads the upper surface of the sensor element and will cause current shunting.

FIGS. 2a, b, c, d are schematic drawings of the preparation of a GMR bottom spin valve for the formation of an abutted junction in accord with the method of the present invention.

FIG. 3 is a schematic drawing of the formation of FIG. 2c subsequent to ion-milling of the abutted junction, but prior to deposition of the biasing or conducting lead layers.

DESCRIPTION OF THE PREFERRED EMBODIMENTS

Figure 4:
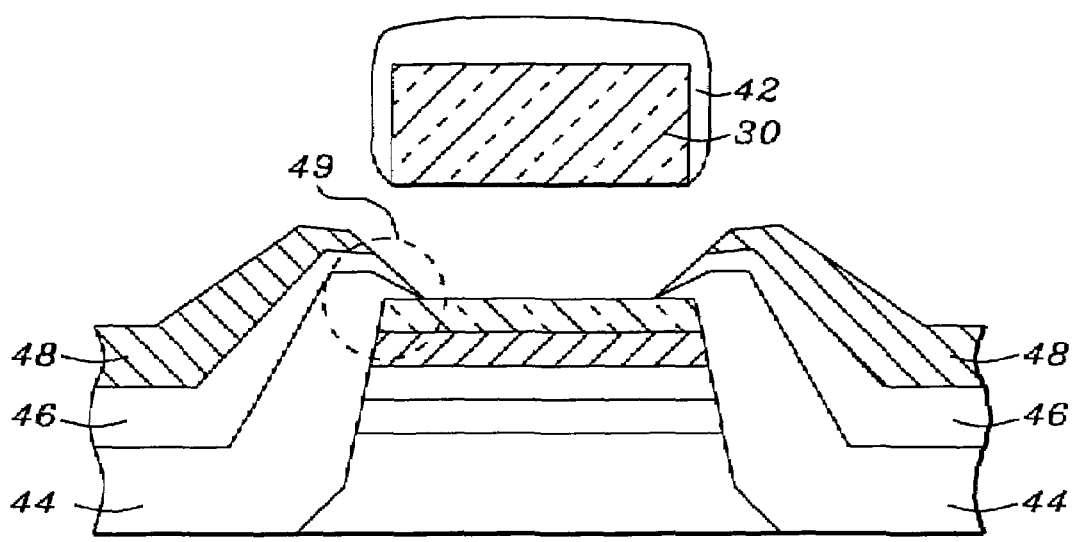
FIG. 4 is a schematic drawing of the formation in FIG. 3 subsequent to the formation of a biasing layer, a lead layer and a capping layer.

The preferred embodiment of the present invention is a method for forming an abutted junction bottom spin valve GMR sensor having a minimal amount of conducting lead and hard biasing layer overspreading the upper surface of the sensor element.

Referring first to FIG. 2a, there is shown a schematic drawing of the first step required to prepare a GMR bottom spin valve sensor element for the abutted junction provided by the method of the present invention. As can be seen in the drawing, there is formed on a substrate (1) a bottom spin valve sensor element (BSV) (10), having a ferromagnetic free layer (12). A spacer layer (14) is formed on the BSV and a capping layer (16) is formed on the spacer layer. In this embodiment the ferromagnetic free layer (12) can be either a layer of CoFe formed to a thickness of between approximately 15 and 25 angstroms, or a composite layer of CoFe/NiFe, wherein the CoFe portion is of thickness between approximately 5 and 15 angstroms and the NiFe portion is of thickness between approximately 20 and 30 angstroms. The spacer layer (14) is provided to prevent diffusion of the capping layer material into the free layer material. In this embodiment the spacer layer is a layer of Ru, formed to a thickness of between approximately 5 and 10 angstroms. Rh can also be used for this layer. The capping layer (16) can be a layer of Ta, formed to a thickness of between approximately 25 and 30 angstroms or, as in this embodiment, it can be a composite layer of Ta/Ru, wherein the Ta is formed to a thickness of between approximately 25 and 30 angstroms and the Ru is formed to a thickness of approximately 10 angstroms.

Referring next to FIG. 2b, there is shown the same schematic as in FIG. 2a wherein the magnetic moments of the pinned (not shown) and free layer (12) have been established by an annealing process. The arrow (18) indicates the direction of magnetization of the free layer.

Referring next to FIG. 2c, there is shown the formation of FIG. 2b subsequent to a reactive ion etch (RIE) to oxidize the Ta portion of the capping layer ((16) in FIG. 2a) to TaOx (20) (shown shaded) and to, thereby, increase the specular reflection of conduction electrons within the read head, following which there is an atomic layer chemical vapor deposition (ALCVD) of alumina (22) to form a layer having a thickness between approximately 50 and 100 angstroms. All numerals are the same as in FIG. 2a. ALCVD of alumina provides a dielectric material that is thinly deposited while providing good step coverage and low pin-hole density. It is to be noted that other dielectric materials with comparable properties such as oxidized Ta, silicon dioxide, composite dielectrics and sputtered alumina can also be used. This layer will serve as an insulating layer between the oxidized Ta (TaOx) portion of the capping layer and the biasing and lead layers to be formed.

Referring next to FIG. 2d, there is shown the formation of FIG. 2c, wherein a etch/deposition mask (30) has been formed above the upper surface of the formation using a suspension bridge pattern that effectively suspends the mask above the surface. Such a mask comprises the upper layer of photoresist (30) shown, formed on an undercut pedestal (which is not shown in this or subsequent figures, for clarity) and it is well known in the art. Although the preferred embodiment shows the use of this mask to form an abutted junction, it can also be used to form an exchange biased junction.

Referring next to FIG. 3, there is shown a shown a schematic drawing of the fabrication in FIG. 2d subsequent to ion-milling of the fabrication to form abutted junctions (40). The mask is shown covered (42) with material that has been redeposited as a result of the milling operation.

Referring next to FIG. 4, there is shown the fabrication of FIG. 3 subsequent to the sequential deposition by ion-beam deposition (IBD) of a hard magnetic material biasing layer (44), a conducting lead layer (46) and an alumina capping layer (48). The biasing layer (44) is preferably CoCrPt formed to a thickness of between approximately 100 and 500 angstroms, but can also be a layer of CoPt formed to the same thickness. The conducting lead layer (46) is preferably a composite layer of Ta/Au/Ta formed to a thickness of between approximately 600 and 1000 angstroms, but may also be formed of other conducting materials such as Ta, Ru or Rh, and the alumina capping layer is formed to a thickness of between approximately 50 and 100 angstroms. As can be seen in the dashed circled area (49), there is some degree of overspreading of the layers. In this process, the mask has served as a protective mask so that the IBD is limited to the junction region.

Figure 5:
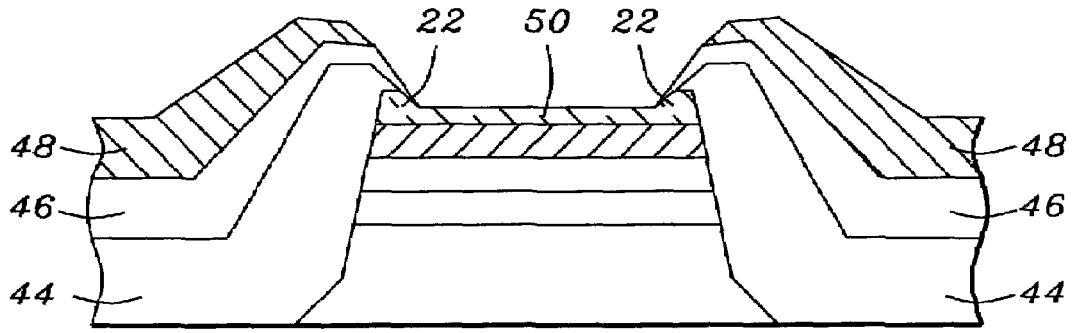
FIG. 5 is a schematic drawing of the formation in FIG. 4 subsequent to the removal of any lead overspreading.

Referring next to FIG. 5, there is shown a schematic drawing of the fabrication of FIG. 4 wherein the mask has been removed and an ion-beam etch (IBE) has been used to remove the overspread of the biasing/lead layer (circled area (49) in FIG. 4). In this process, the ALCVD alumina layer (22) protects the elements of the GMR sensor beneath it and is slightly etched away (50) as a result.

Figure 6:
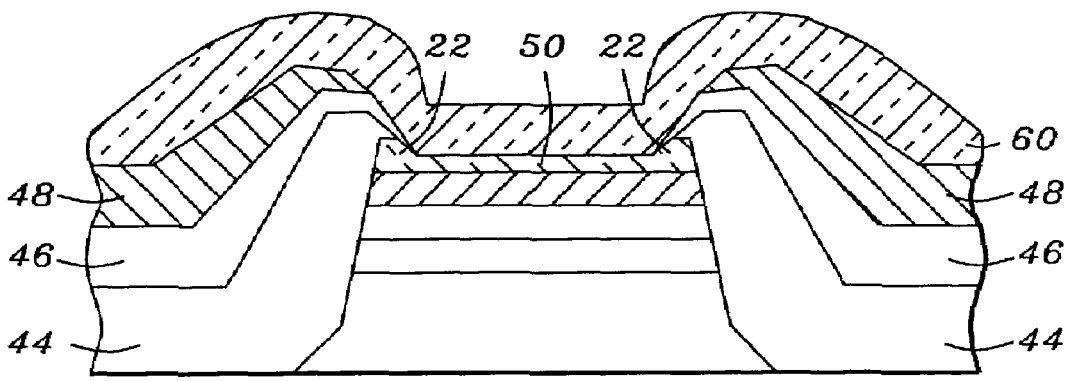
FIG. 6 is a schematic drawing of the formation of FIG. 5 subsequent to the formation of a dielectric layer over the formation.

Referring finally to FIG. 6, there is shown a schematic drawing of the fabrication of FIG. 5 wherein a dielectric layer (60) has been formed over the upper surface of the fabrication, thereby covering the alumina capping layers (48) and (22) and the exposed portions of the biasing (44) and conducting lead layers (46). The dielectric layer can serve as an insulating layer between the fabrication and an upper shield layer (not shown) and is preferably an ALCVD layer of alumina deposited to a thickness of between approximately 100 and 500 angstroms.

As is understood by a person skilled in the art, the preferred embodiment of the present invention is illustrative of the present invention rather than being limiting of the present invention. Revisions and modifications may be made to methods, processes, materials, structures, and dimensions through which is formed an abutted junction GMR bottom spin valve sensor having minimal overspread of its biasing layer and conducting lead layer, while still providing an abutted junction GMR bottom spin valve sensor having minimal overspread of its biasing layer and conducting lead layer as defined by the appended claims.

What is claimed is:

1. An abutted junction GMR bottom spin valve sensor having minimal overspread of its longitudinal hard bias layer and conducting lead layer comprising:
   a substrate;
   a bottom spin valve sensor element formed on the substrate, wherein the magnetic layers are appropriately magnetized;
   a spacer layer formed on the sensor element;
   a first capping layer formed on the spacer layer;
   a thin dielectric layer formed on the first capping layer; and wherein said sensor element, said spacer layer, said first capping layer and said thin dielectric layer are patterned by the formation of opposing, planar, lateral edges;
   a longitudinal biasing layer of hard magnetic material formed contacting said lateral edges of the sensor element and all said layers formed over said sensor element in an abutted junction;
   a conducting lead layer formed on the longitudinal biasing layer, the overspread of the biasing layer and the conducting lead layer being removed and a central portion of the thin dielectric layer being partially removed;
   a second capping layer formed on the conducting lead layer;
   a blanket insulating layer formed conformally over the upper surfaces of the second capping layer, the thin dielectric layer and exposed portions of the biasing layer and conducting lead layer.

2. The sensor of claim 1 wherein the spacer layer formed on the sensor element is a layer of material that prevents diffusion of said capping layer into said GMR sensor element and wherein said material is Ru.

3. The sensor of claim 1 wherein the first capping layer is a composite layer of Ta/Ru, wherein the Ru layer is formed to a thickness of approximately 10 angstroms and the Ta is formed to a thickness between approximately 25 and 30 angstroms and is subsequently oxidized.

4. The sensor of claim 1 wherein the thin dielectric layer is a layer of dielectric material that can be thinly formed, has good step coverage, has a low density of voids and pinholes and can act as an insulating layer between the first capping layer and the biasing and conducting lead layers.

5. The sensor of claim 4 wherein the thin dielectric layer is a layer of material chosen from the group including Ta oxide, sputtered alumina, ALCVD alumina, silicon dioxide and composite dielectrics.

6. The sensor of claim 5 wherein the thin dielectric layer is a layer of ALCVD alumina formed to a thickness of between approximately 50 and 100 angstroms.

7. The sensor of claim 1 wherein the hard magnetic material of the longitudinal biasing layer is CoCrPt.

8. The sensor of claim 7 wherein the hard magnetic material is formed by ion-beam deposition to a thickness of between approximately 100 and 500 angstroms.

9. The sensor of claim 1 wherein the conducting lead layer is a composite layer formed of Ta/Au/Ta.

10. The sensor of claim 9 wherein the Ta/Au/Ta is formed by ion-beam deposition to a thickness of between approximately 600 and 1000 angstroms.

11. The sensor of claim 1 wherein the second capping layer is a layer of alumina formed by ion-beam deposition to a thickness of between approximately 50 and 100 angstroms.

12. The sensor of claim 1 wherein the blanket insulating layer is a layer of alumina formed by ALCVD to a thickness between approximately 100 and 500 angstroms.

* * * * *